United States Patent [19]

Sugai et al.

[11] Patent Number: 5,196,720

[45] Date of Patent: Mar. 23, 1993

[54] NARROW BAND INTERFERENCE SIGNAL REMOVING DEVICE

[75] Inventors: Kazuyoshi Sugai; Katsuyuki Omori, both of Tokyo, Japan

[73] Assignee: Clarion Co., Ltd., Tokyo, Japan

[21] Appl. No.: 521,142

[22] Filed: May 8, 1990

[30] Foreign Application Priority Data

| May 15, 1989 | [JP] | Japan | 1-120880 |
| Oct. 13, 1989 | [JP] | Japan | 1-267503 |
| Oct. 31, 1989 | [JP] | Japan | 1-283820 |
| Dec. 14, 1989 | [JP] | Japan | 1-325652 |
| Dec. 26, 1989 | [JP] | Japan | 1-337839 |

[51] Int. Cl.$^5$ .............. H01L 29/84; H01L 41/02; H03H 9/25

[52] U.S. Cl. .............. 257/254; 257/416; 333/193; 333/194; 310/313 R; 310/313 B

[58] Field of Search ........ 310/313 R, 313 B; 333/193, 194; 357/26

[56] References Cited

U.S. PATENT DOCUMENTS

| 3,675,140 | 7/1972 | Fang et al. | 357/26 |
| 4,060,833 | 11/1977 | Onyshkevych | 333/194 |
| 4,468,639 | 8/1984 | Green et al. | 357/26 |
| 4,697,115 | 9/1987 | Mitsutsuka | 333/193 |
| 4,967,113 | 10/1990 | Mitsutsuka | 310/313 R |
| 5,028,101 | 7/1991 | Sugai et al. | 333/193 |
| 5,033,063 | 7/1991 | Okamoto et al. | 375/90 |

FOREIGN PATENT DOCUMENTS 1569362 6/1980 United Kingdom .
2221588A 2/1990 United Kingdom .

OTHER PUBLICATIONS

Moriizumi et al., 1978 Ultrasonics Symp. Proceed., pp. 54-59, IEEE, Cat. #78 CH1344-1SV, "A ZnO/Si SAW . . . Effect".

8030 Electronics Letter, vol. 14, No. 17 (1978.08), pp. 562-564 "Adaptive Filter Based on S.A.W. Monolithic Storage Correlator", P. M. Grant, G. S. Keno.

IBM Technical Disclosure Bulletin, vol. 12, No. 5, Oct. 1969, pp. 638-639, "Detection of Piezoelectric Surface Acoustic Waves", C. G. Powell and H. G. Lean.

Primary Examiner—Jerome Jackson, Jr.
Attorney, Agent, or Firm—Flynn, Thiel, Boutell & Tanis

[57] ABSTRACT

A narrow band interference signal removing device uses first diode arrays and second diode arrays both provided in propagation paths of surface acoustic waves in order for the first diode arrays to detect the signal magnitude of a surface acoustic wave propagating in an opposite direction to obtain information on the spectrum magnitude of an input signal and responsively control a bias to the second diode arrays.

22 Claims, 15 Drawing Sheets

NARROW BAND INTERFERENCE SIGNAL REMOVING DEVICE

FIELD OF THE INVENTION

This invention relates to an improvement of a narrow band interference signal removing device suitable for a spread-spectrum (SS) communication system.

BACKGROUND OF THE INVENTION

A spread-spectrum (SS) communication system using a wide frequency band involves a problem that high level narrow band interference often disables communication or increases errors. In order to overcome the problem, a filter using a surface acoustic wave (SAW) has been invented.

The present inventors et al. have already filed Japanese patent applications No. 180822/1988, 278769/1988 and 284884/1988 (all corresponding to U.S. Pat. No. 5,028,101) in the attempt to overcome the above-identified problem.

There is room for improvements in the following respects in the preceding inventions.

In the applications 278769/1988 and 284884/1988, for example, adaptive operation for narrow band interference suppression is performed using a self-biasing effect of pn diode arrays provided in a surface-acousticwave (SAW) element. In this case, the input signal needs to have a relatively large power.

In the application 180822/1988, since it uses a programmable notch filter which has not an adaptive function, an entered signal monitor circuit and a bias control circuit are required as external circuits.

OBJECT OF THE INVENTION

It is therefore an object of the invention to establish a high performance for an adaptive system for narrow band interference suppression which is useful in a spread-spectrum communication system or the like.

A further object of the invention is to provide a narrow band interference signal removing device comprising a SAW device which consumes a current small enough to be disregarded, has an excellent temperature characteristic and is variable in the SAW loss.

A still further object of the invention is to provide a narrow band interference signal removing device capable of reducing the influences of noise.

SUMMARY OF THE INVENTION

In order to attain the above objects, the invention is based on a narrow band interference signal removing device including a multi-layer structure having at least a silicon substrate and a piezoelectric film, input transducers, output transducers and gate electrodes all formed on the piezoelectric film, and the invention is characterized in the use of arrays of first PN diodes formed on said silicon substrate in a zone between said input and output transducers; arrays of second PN diodes provided on said silicon substrate in a zone opposite to said first diode arrays with respect to said input transducers; detection terminals independently extending from respective said second PN diode arrays; and bias applying terminals independently extending from respective said first PN diode arrays.

The present invention adds to one of the preceding inventions a function of monitoring the spectrum magnitude of an entered signal. In an existing element, the signal magnitude of one of two surface acoustic waves introduced by input transducers and propagating in opposite directions is controlled by pn diode arrays provided in a propagation path. That is, the other surface acoustic wave propagating in the opposite direction is not used.

The present invention has improved the device so as to allow it to detect the signal magnitude of the surface acoustic wave propagating in the opposite direction with pn diodes and obtain information on the spectrum magnitude of the entered signal so that a feed back circuit can control the propagation with a lower input power.

DETAILED DESCRIPTION

Figure 1A:
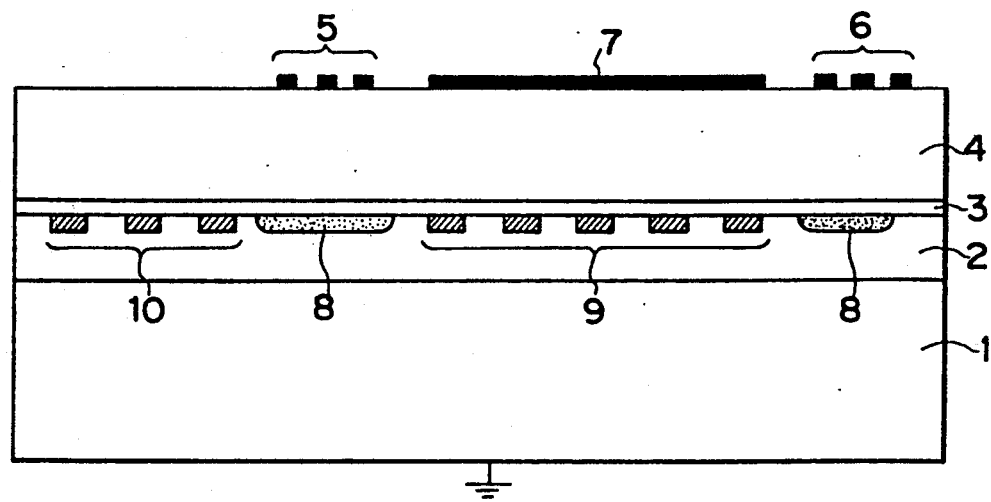
FIGS. 1A, 1B, 2A and 2B are schematic A-A' line cross-sectional views and plan views of different embodiments of the invention.

The invention is described below, referring to preferred embodiments illustrated in the drawings.

Figure 1B:
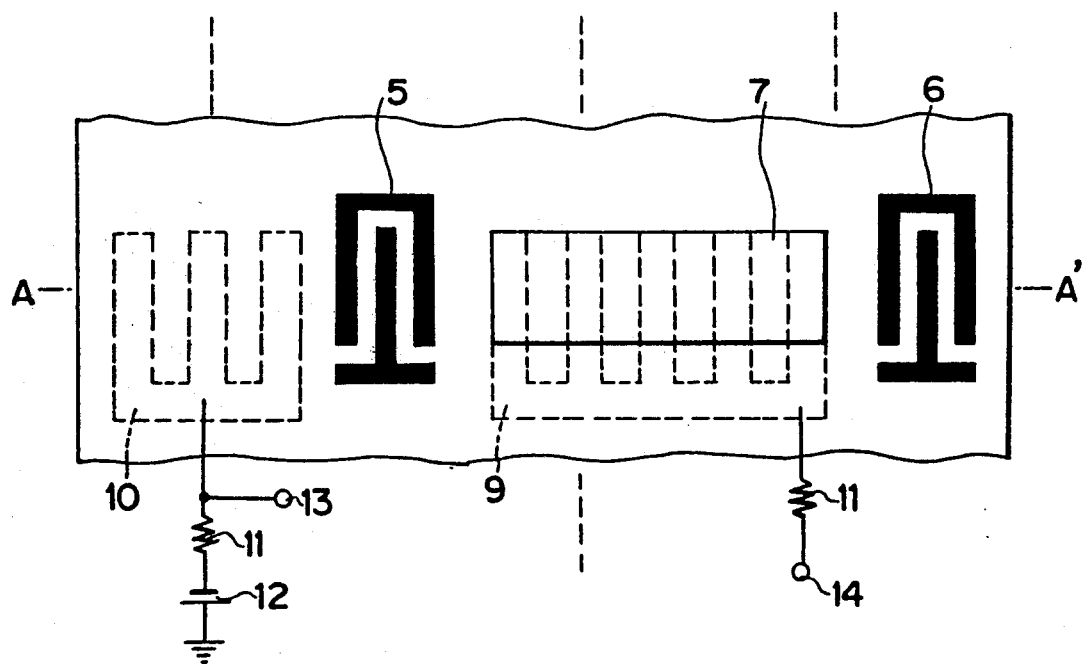

FIGS. 1A and 1B show an arrangement of a SAW element forming one channel in an inventive narrow band interference signal removing device and having a certain center frequency.

In these drawings, reference numeral 1 refers to a $p^+(n^+)$ Si monocrystalline substrate, 2 to a p(n) type Si epitaxial layer provided on the substrate 1, 3 to a thermal oxide layer provided on the epitaxial layer 2, 4 to a ZnO piezoelectric layer provided on the thermal oxide layer 3, and 5, 6 and 7 to metal electrodes which behave as an input surface wave comb shaped transducer, an output surface wave comb-shaped transducer and a gate electrode, respectively. Reference numeral 8 denotes a high density impurity diffused region provided in the p(n) type Si epitaxial layer 2 under each transducer metal electrode to improve the excitation efficiency of the transducer. Reference numeral 9 denotes an array of n+(p+) impurity diffused regions provided in the p(n) type Si epitaxial layer 2 under the gate electrode 7. Thus a first pn diode array is formed along the SAW propagation path. The pn diode array behaves to vary the attenuation constant of a SAW by as large as 100 dB/cm or more due to an interaction between the SAW and a carrier under control of the carrier density in the epitaxial layer by control of a diode bias. That is, the pn diode array has a function of high speed on/off controls of the channel. Reference numeral 10 designates an array of n(p) impurity diffused regions provided in the p(n) type Si epitaxial layer 2 outside the input transducer to form a second pn diode array. Reference numeral 11 refers to a resistor connected to the pn diode array, and 12 to a DC source. 13 denotes a monitor terminal where a voltage signal indicative of a surface acoustic wave which has been converted from the entered signal and detected by the second pn diode array is obtained. The terminal 13 monitors the magnitude (power) of the input signal to the channel (frequency range) as a voltage variation. Numeral 14 denotes a bias control terminal of the first pn diode array.

Figure 2A:
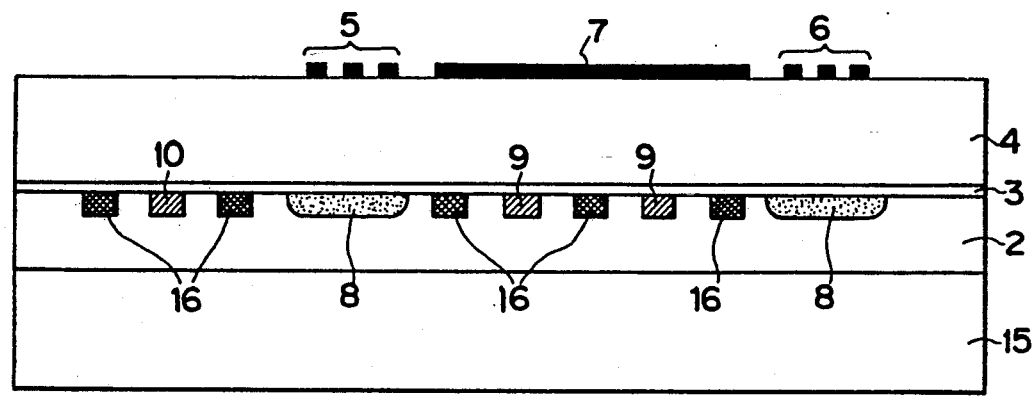
Figure 2B:
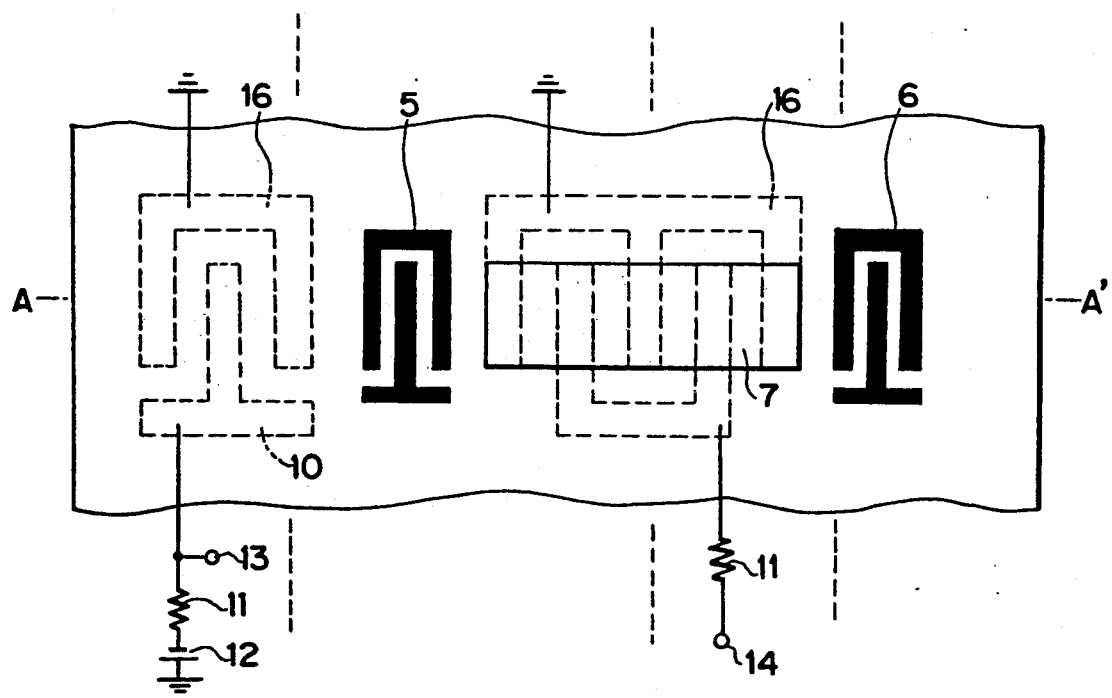

FIGS. 2A and 2B show a further embodiment of the invention which is an improvement of one of the preceding inventions. Its function is the same as that of the embodiment of FIGS. 1A and 1B except that a high resistance Si monocrystalline substrate 15 is used as the substrate and p+(n+) impurity diffused regions 16 are provided in the p(n) type Si epitaxial layer 2 between the $n^{30}$(p+) impurity diffused regions 9 and between the n(p) regions 10. That is, they are different in that ohmic contact of the p+(n+) regions is established at the back surface in FIGS. 1A and 1B and at the front surface in FIGS. 2A and 2B. The arrangement of FIGS. 2A and 2B is advantageous in that the thickness of the epitaxial layer and the pitch interval of the pn diode array can be controlled independently, and it has a higher performance as a filter arrangement than the arrangement of FIGS. 1A and 1B.

Further, although not shown, there is another improvement of the preceding application. That is, the first pn diode array (9, 9 and 16) for propagation controls of FIGS. 1A, 1B, 2A and 2B can extend under the input transducer 5, thereby to further improve the filter characteristic. A SAW signal detecting function of the second pn diode array is explained below. The second pn diode array 10 provided outside the input transducer 5 is biased by the DC source 12 via the resistor 11. The optimum bias point for the detection sensitivity of a surface acoustic wave is at a slightly forward-biased point. A surface acoustic wave converted by the input transducer propagates on the second pn diode array and modulates the diode potential spatially and in time. A non-linear resistance of the second pn diodes causes generation of a d.c. component depending on the SAW signal magnitude, and the potential of the monitor terminal 13 is shifted from an initial bias voltage to a reverse bias voltage. The shifted amount corresponds to the input signal magnitude.

Figure 3:
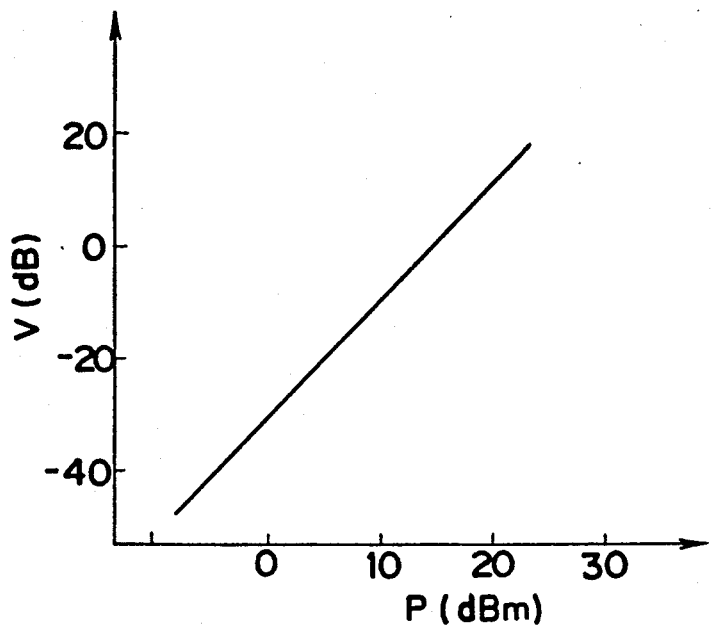
FIG. 3 is a view showing the relationship between an input signal monitor terminal voltage and an input power in the same embodiments.

FIG. 3 shows the relationship between the power p of the input signal and the bias shift amount V of the monitor terminal The bias shift amount V is proportional to the square value of the SAW power (input signal power P). Thus the SAW potential is squaredetected by the pn diode array provided outside the input transducer, and the input signal magnitude is obtained as a base band signal.

Therefore, by parallely connecting the abovedescribed SAW elements having different center frequencies to form multiple channels, information on the distribution of the frequency spectrum magnitude of the entered signal is readily obtained.

Figure 4:
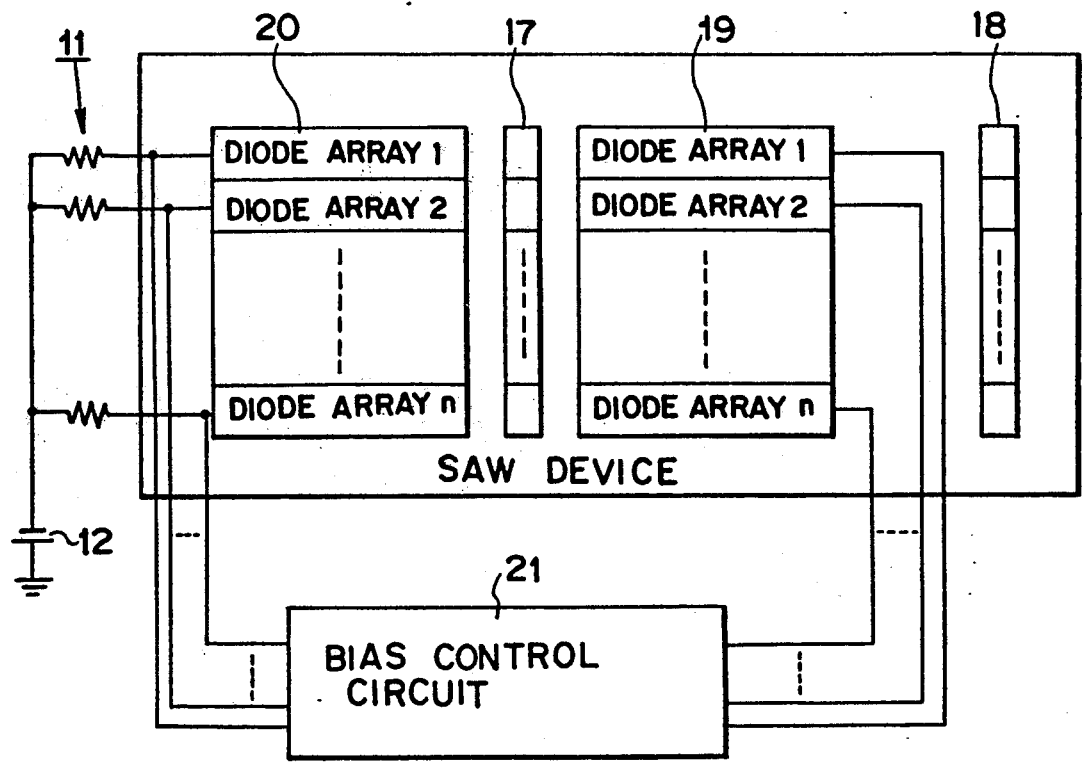
FIG. 4 is a block diagram showing an arrangement of the inventive narrow band interference suppressing filter system.

FIG. 4 shows an arrangement of a narrow band interference suppressing filter system in which n channels of the above-indicated SAW elements are connected in parallel. The narrow band interference suppressing filter is hereinafter called AISF (Adaptive Interference Suppression Filter).

The arrangement in FIG. 4 including input transducers 17 and second pn diode arrays 20 is a portion for monitoring the magnitude distribution of the input spectrum. The input transducers 17 and the output transducers 18 behave as sorting filters which sort the input signal according to its frequencies, causing surface acoustic waves corresponding to the input signal to propagate in propagation paths corresponding to the respective frequencies, and thereafter recompose them.

Arrangement of respective channels which form sets of the input transducer, output transducer, first pn diode array and second pn diode array is as described above. First pn diode arrays 19 on the SAW propagation paths provided in respective channels control the SAW attenuation constants of respective channels.

The AISF system of FIG. 4 operates as follows. The input signal is converted into surface acoustic waves by the input transducers 17. The bias shift amount (voltage signal) of each of the second pn diode arrays 20 is monitored, and accordingly, a bias control circuit 21 controls the bias voltage of the associated first pn diode for propagation control.

A function of the bias control circuit 21 is to amplify the bias shift amount of the second pn diodes 20 corresponding to the signal magnitude of each channel and bias in the reverse direction the pn diodes 19 in a channel having a large shift amount. Alternatively, the bias control circuit 21 functions to not only amplify the bias shift amount but also to set a certain threshold value to cause a comparator to turn on (forward bias) or turn off (reverse bias) the bias of the first pn diodes 19.

Referring to FIGS. 1, 2 and 4, it is noted that the AISF system of FIG. 4 is advantageous in that it can monolithically be integrated in the same Si substrate, and it ensures a high performance and scale reduction of the system.

Figure 5A:
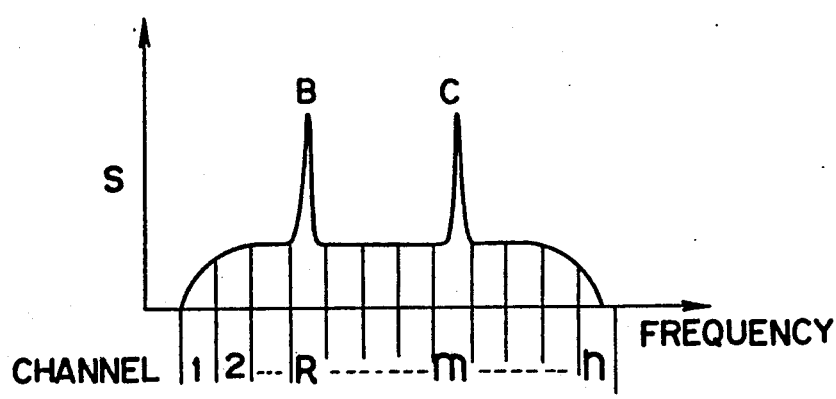
FIGS. 5A, 5B and 5C are views showing a flow of signal processings by the same system.
Figure 5B:
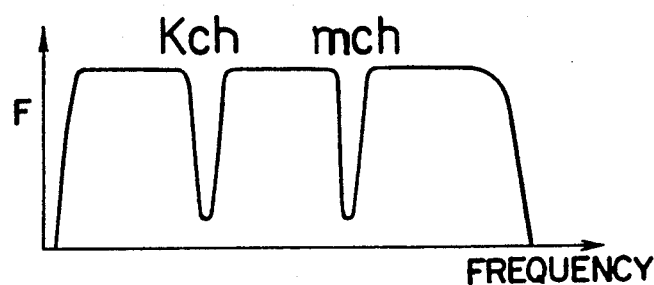
Figure 5C:
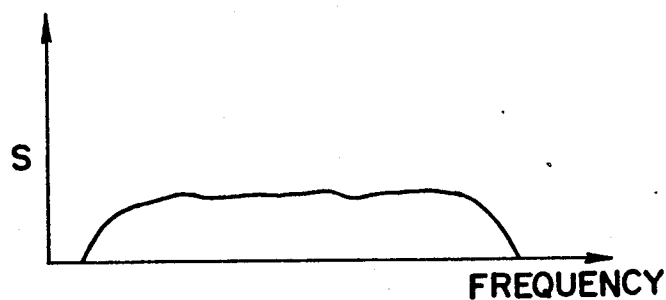

FIGS. 5A to 5C show a flow of signal processings of the AISF system. FIG. 5A shows a curve of the input signal spectrum (magnitude) S of a wide band SS-DS signal (A) with narrow band interference waves (B and C) mixed thereto.

Channels numbered k and m corresponding to frequencies of the interference waves B and C are detected, and according to the environment, the filter passing characteristic F of the AISF system represents the aspect shown in FIG. 5B where notches are formed at portions of the channels k and m. The spectrums of the output signal of the AISF system having the aboveindicated characteristic is as shown in FIG. 5C where the interference waves B and C are suppressed.

Figure 6:
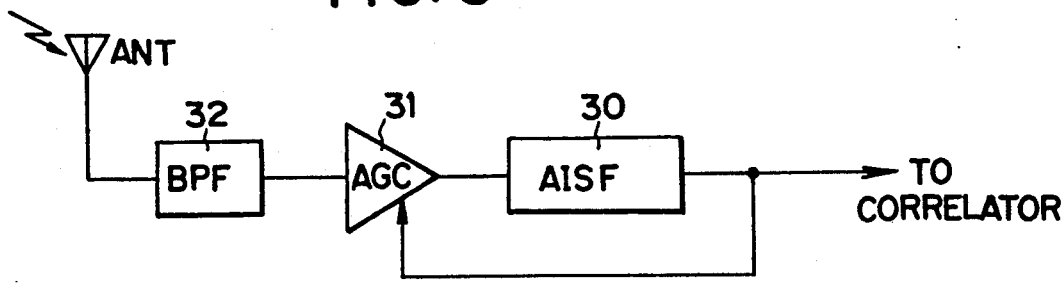
FIG. 6 is a fragmentary block diagram of a receiver section in a DS-SS system using the system of FIG. 4.
Figure 7A:
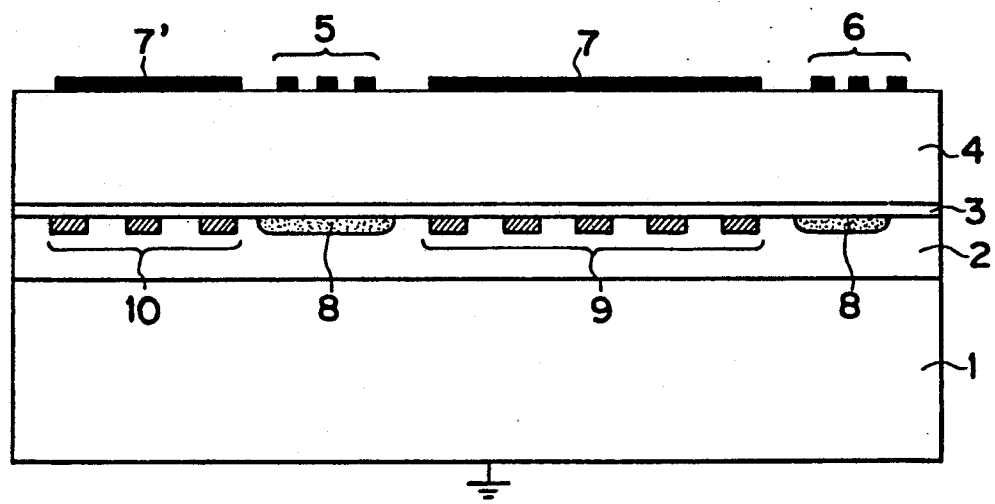
FIGS. 7A, 7B, 8A and 8B are A-A' line cross-sectional views and plan views of modifications of the embodiments of FIGS. 1A, 1B, 2A and 2B.
Figure 7B:
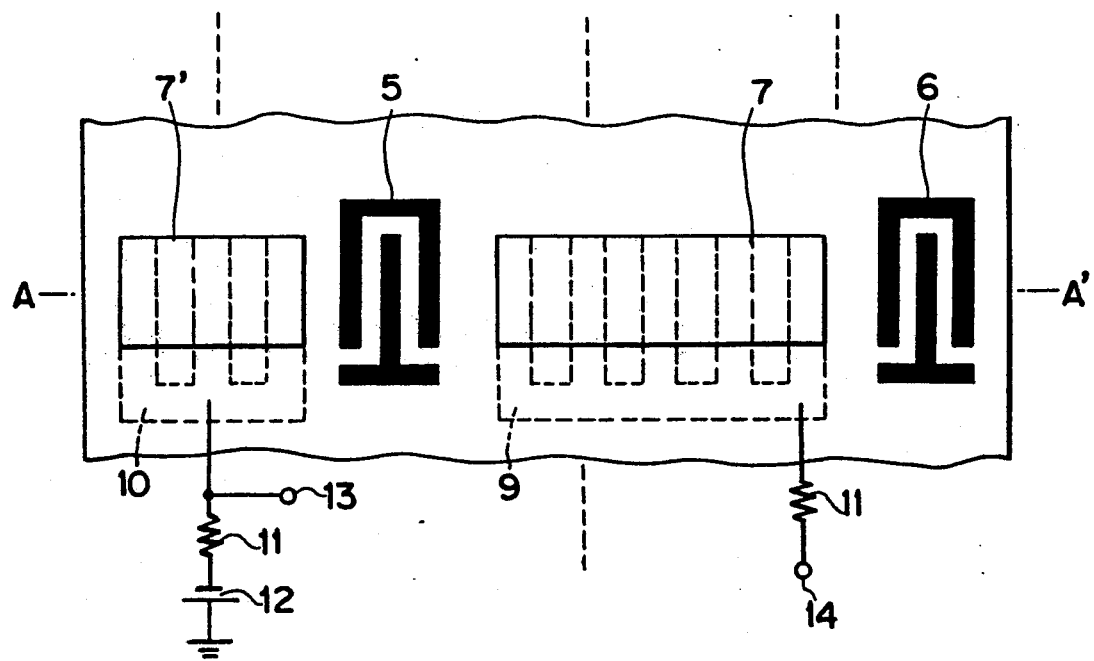
Figure 8A:
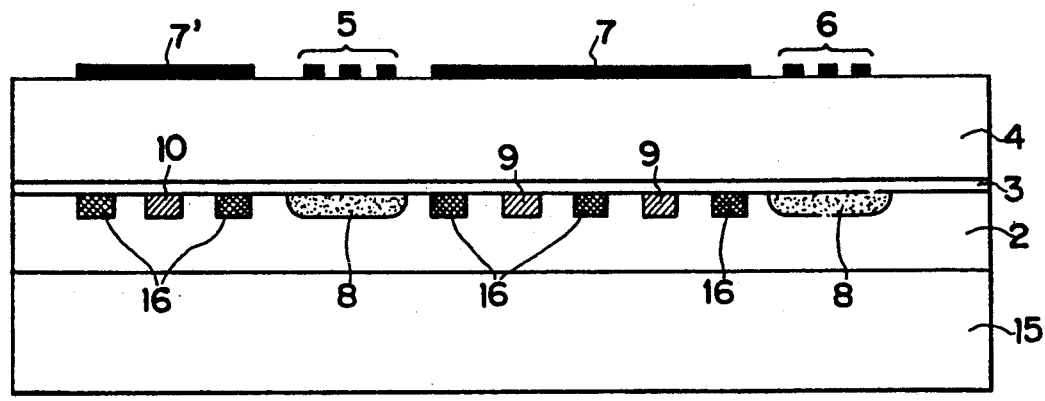
Figure 8B:
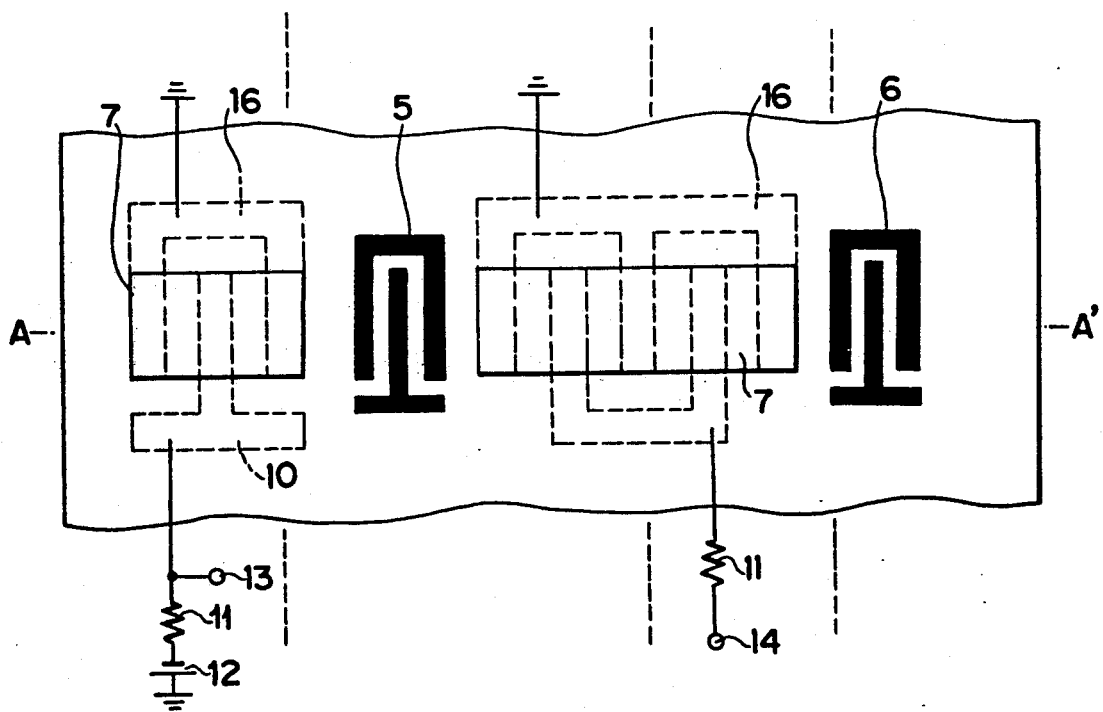

FIG. 6 shows an arrangement of a DS-SS system which includes the AISF system of FIG. 4 at the input stage of its receiver section. The AISF system at 30 is provided in the front stage of a correlator, and an AGC (automatic gain control) circuit 31 is provided in the front stage of the AISF system 30. In this arrangement of the system, an output of the AISF system 30 is fed back to the AGC circuit 31 to cause it to control the gain of an amplifier. Reference numeral 32 designates a band pass filter. If the AGC circuit alone is provided without the AISF system, in the presence of a narrow band interference wave of a large power, the interference signal itself controls the gain, and disables communication and causes increased errors in the DS-SS communication system. The AISF system 30, however, enables gain control based on the signal magnitude of the signal with interference waves suppressed, i.e. the spread spectrum signal itself, and the function of the DS-SS system is remarkably improved.

In FIGS. 7A, 7B, 8A and 8B which show modifications of the embodiments of FIGS. 1A, 1B, 2A and 2B, a gate electrode 7' is provided on the ZnO piezoelectric layer at a position corresponding to the second diode array 10.

Figure 9:
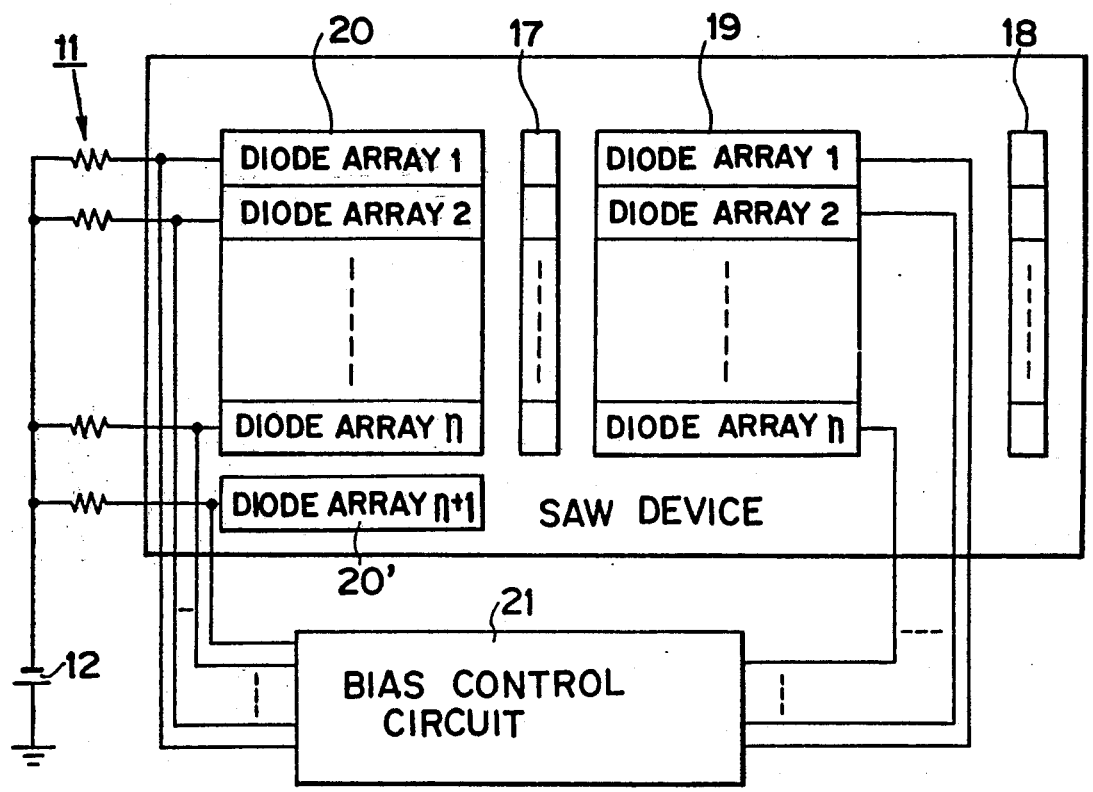
FIGS. 9 and 10 are block diagrams of a further embodiment of the invention.
Figure 10:
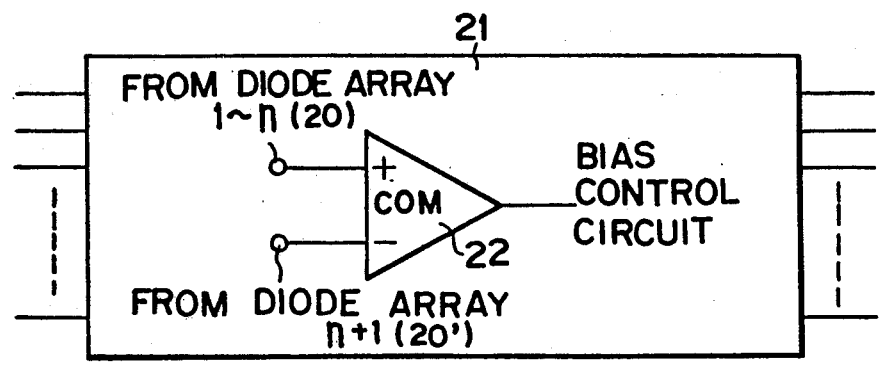
Figure 11A:
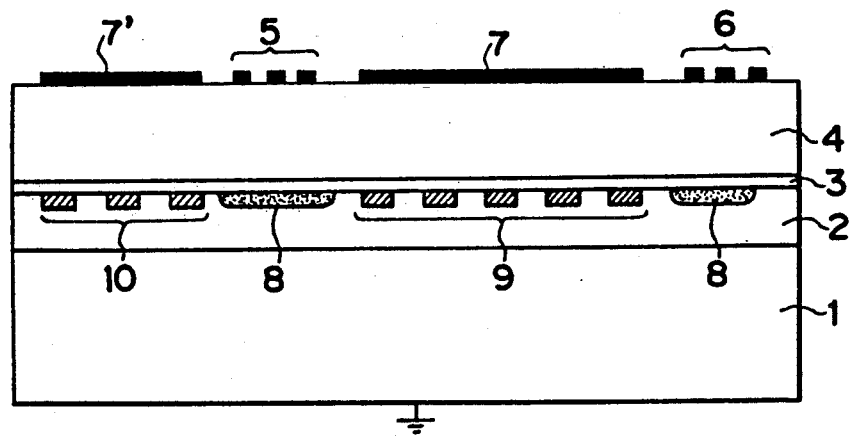
FIGS. 11A to 14C are A-A' line cross-sectional views, upper views and B-B' line cross sectional views of a SAW element arrangement forming one channel in respective embodiments.
Figure 11B:
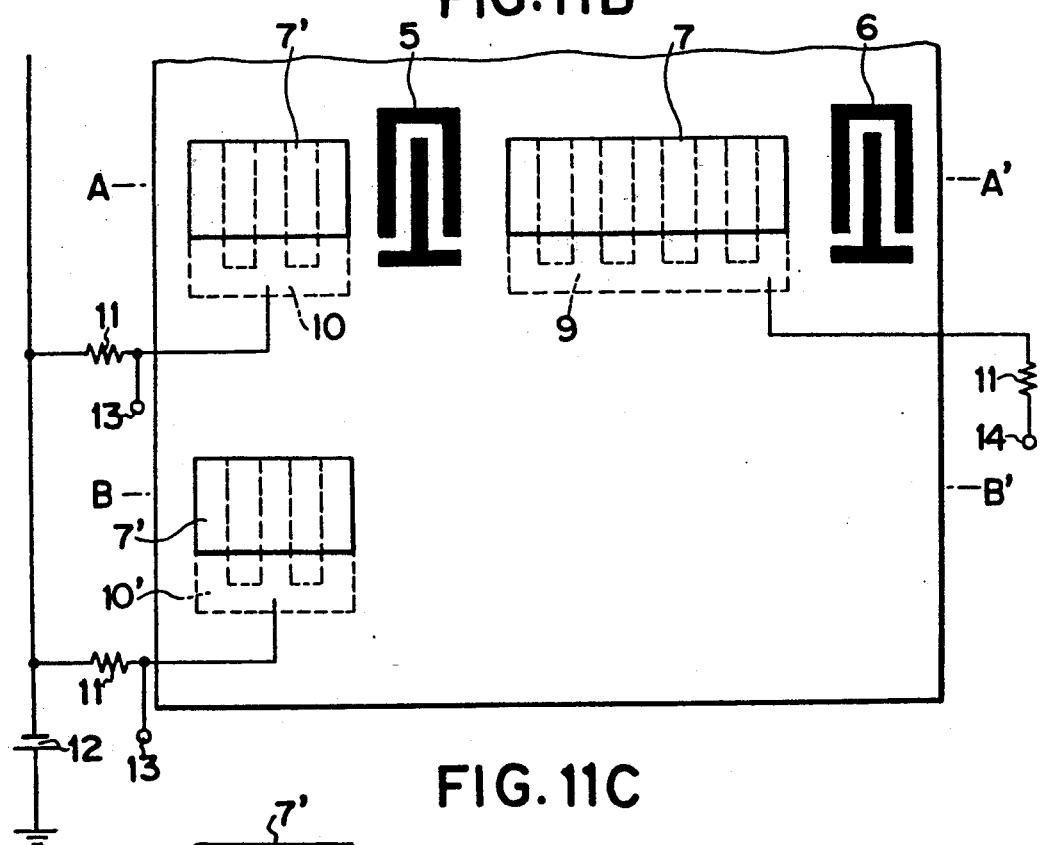
Figure 11C:
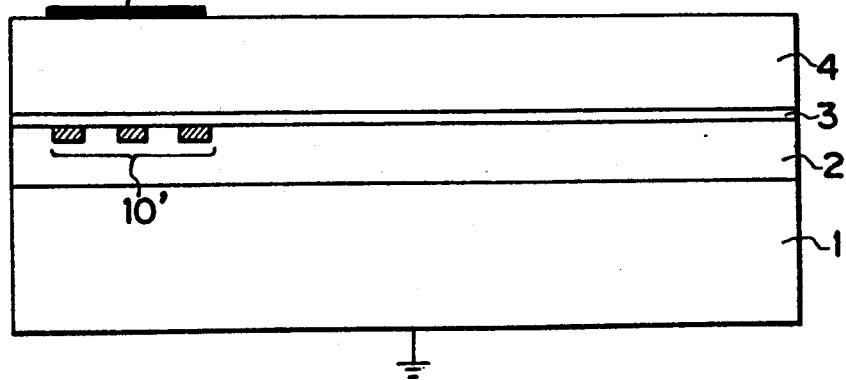

FIGS. 9 and 10 show an embodiment for preventing erroneous operation of the bias control circuit 21 caused by a noise. For this purpose, a third PN diode array 20' substantially in the same form as the second pn diode array 20 is provided outside the propagation path of surface acoustic waves.

Since the third pn diode array functions as a reference signal source, influence from a noise can be reduced by taking the difference between the voltage of the third pn diode array and the potential of each second pn diode array.

The device of FIG. 9 is different from the arrangement of FIG. 1 in that the third pn diode array 20' is provided. The diode array 20' has substantially the same configuration as each second pn diode array 20 and located outside the SAW propagation path on the same SAW element chip. A detection terminal of the third pn diode array 20' is extended independently of those of the second pn diode arrays 20 and is connected to the bias control circuit 21. It is also connected to the d.c. source via the resistor 11.

In the bias control circuit 21 is provided a comparator circuit 22 as shown in, for example, FIG. 10. To its plus (+) terminal is applied a detection signal from each detection terminal of the second pn diode arrays 20, and to its minus (−) terminal is applied a detection signal from the detection terminal of the third pn diode array 20'.

The third pn diode array 20', which is located outside the SAW propagation path, behaves as a reference signal source.

Therefore, a potential difference between the second and third pn diode arrays is taken by the comparator circuit 22 in the bias control circuit 21, and the difference signal is processed as an effective detection signal. Thus by using the difference signal as the detection signal, influence from a noise is reduced.

FIGS. 11A through 14C are schematic views of various embodiment of the inventive SAW element. FIGS. 11B, 12B, 13B and 14B are top views of the elements, FIGS. 11A, 12A, 13A and 14A are cross-sectional views taken along A-A' lines of their respective top views, and FIGS. 11C, 12C, 13C and 14C are cross-sectional views taken along B-B' lines of their respective top views. In FIGS. 11B and 11C, reference numeral 10' denotes n(p) impurity diffused regions provided in the p(n) type Si epitaxial layer 2 to form a third diode array.

Figure 12A:
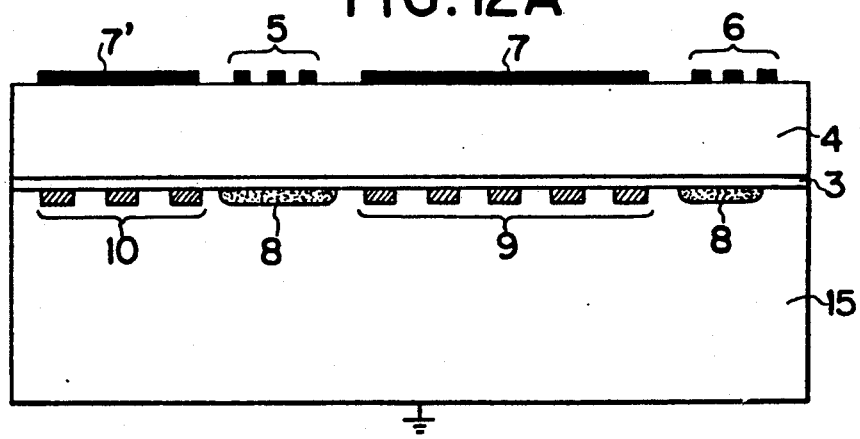
Figure 12B:
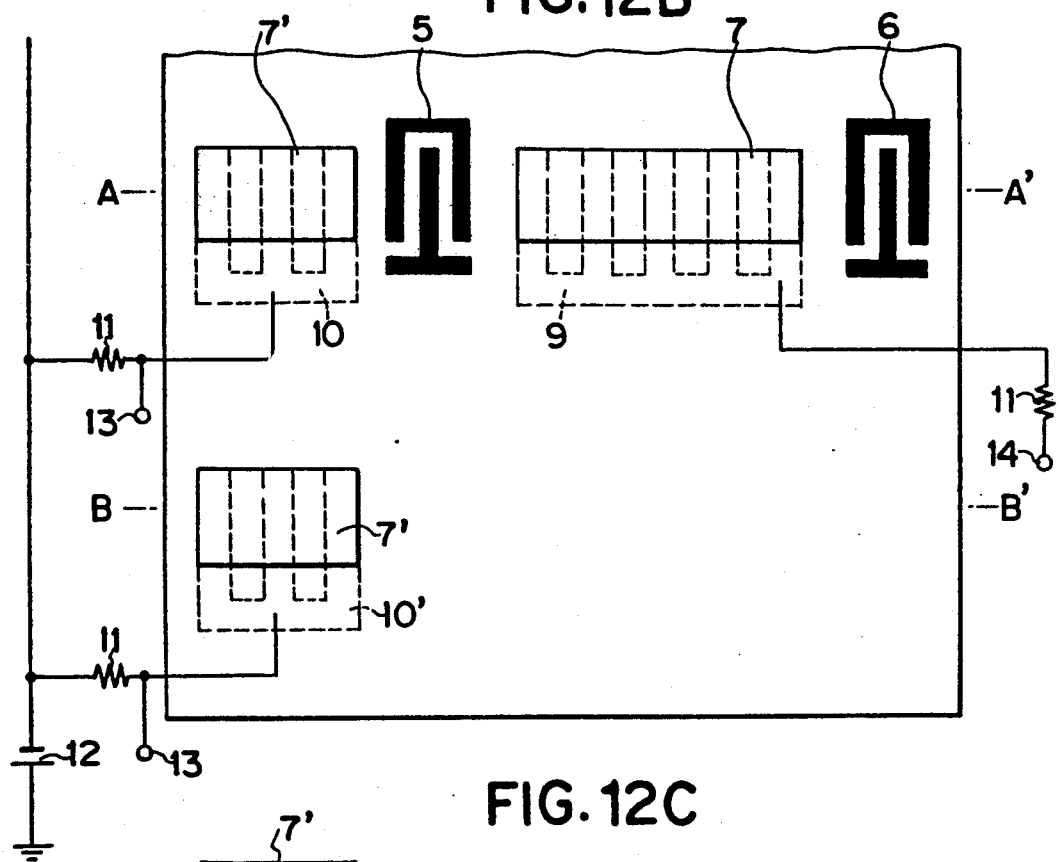
Figure 12C:
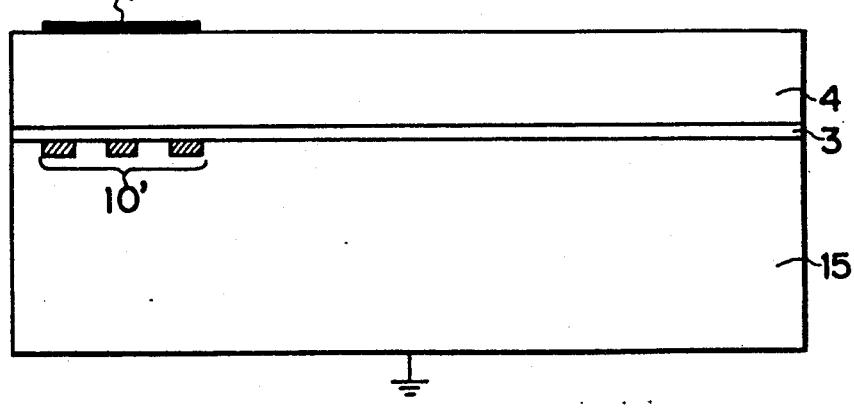
Figure 13A:
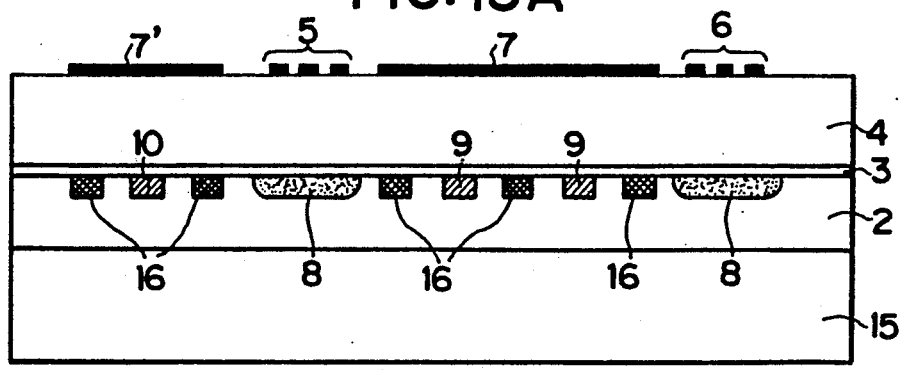
Figure 13B:
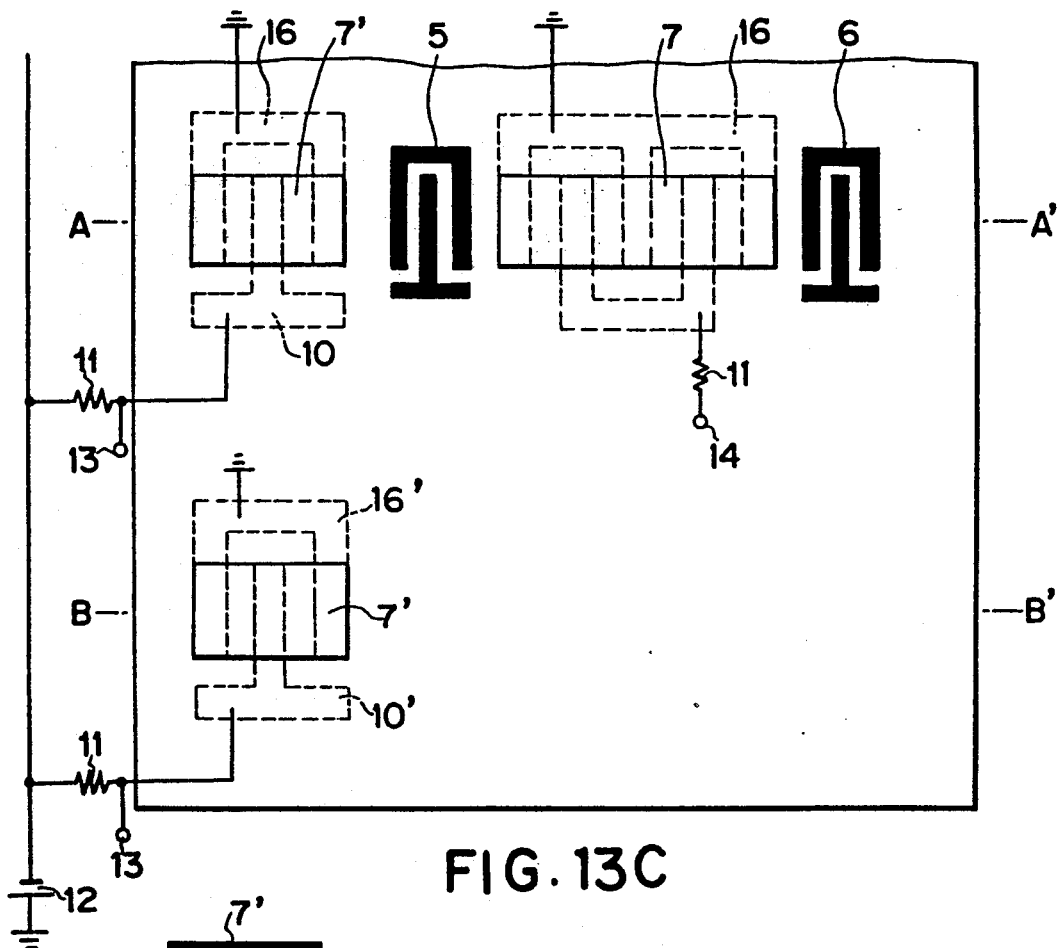
Figure 13C:
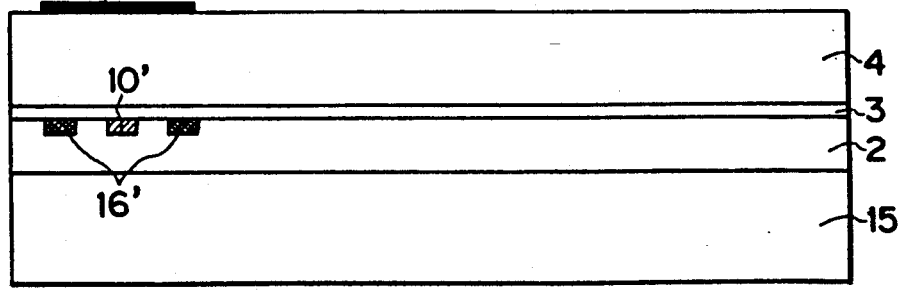
Figure 14A:
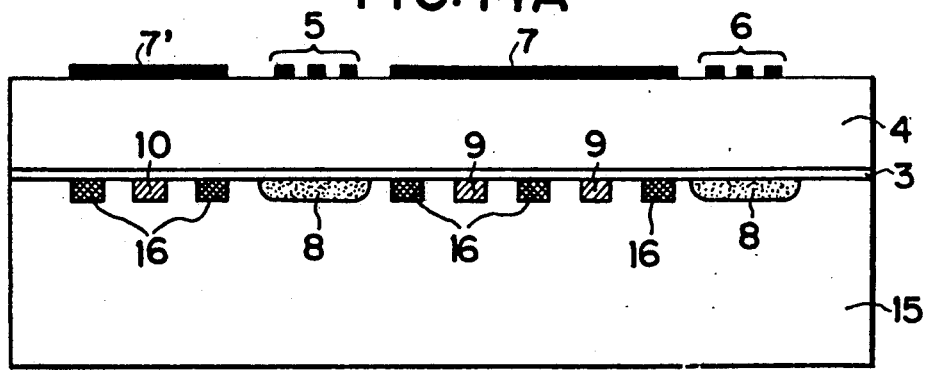
Figure 14B:
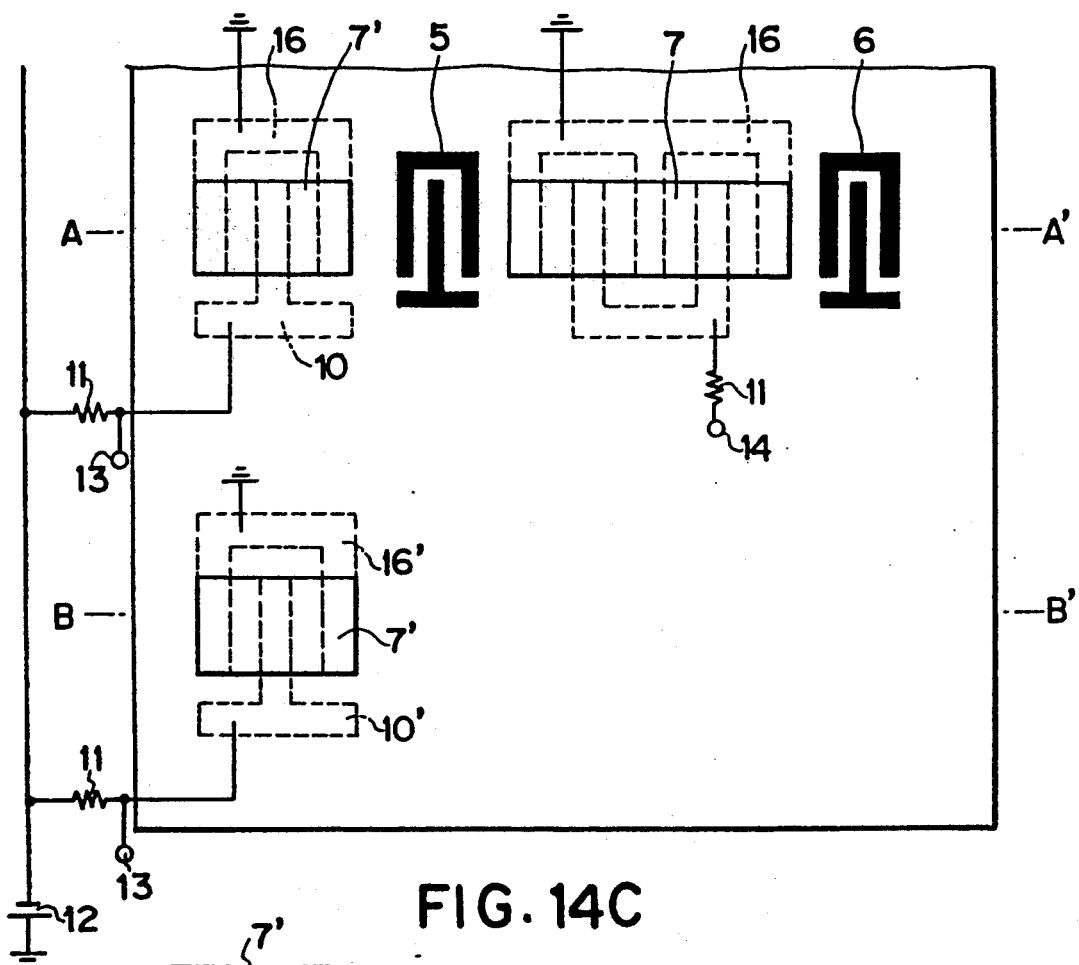
Figure 14C:
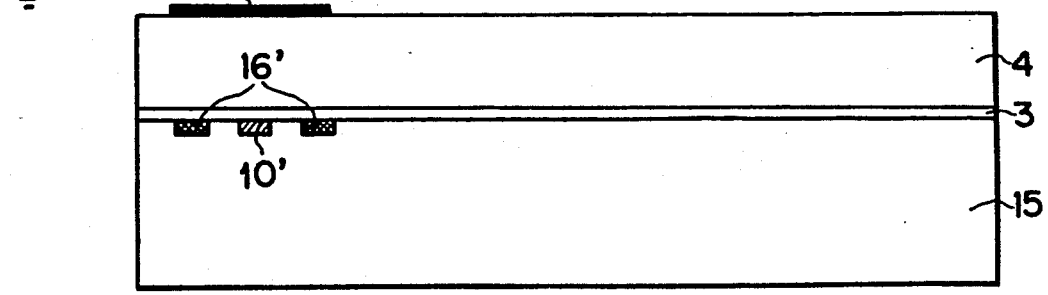
Figure 15A:
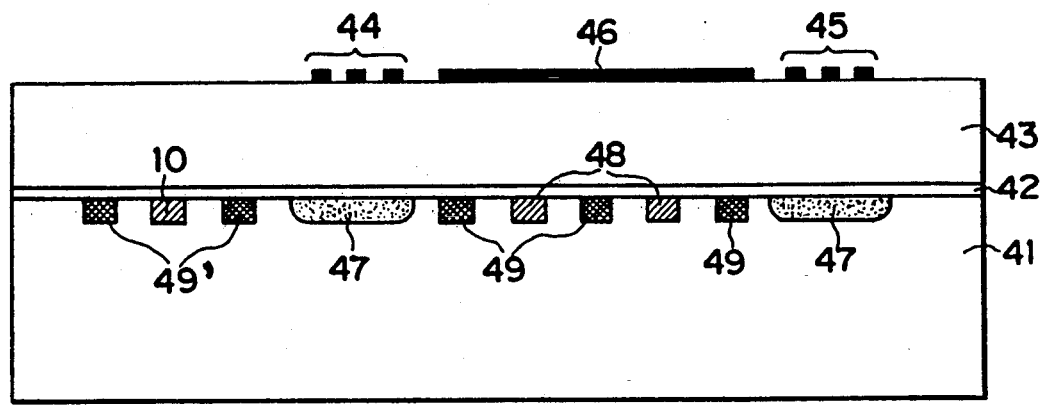
FIGS. 15A, 15B, 16A and 16B are A-A' line cross-sectional views and upper views of still further embodiments of the invention.
Figure 15B:
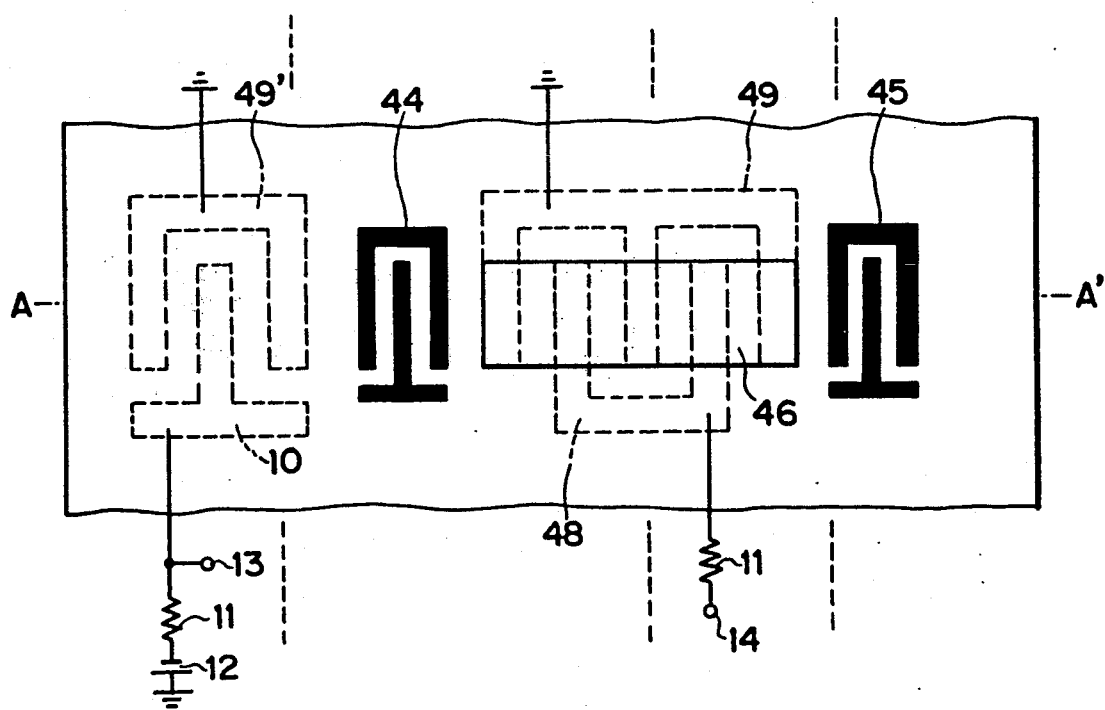
Figure 16A:
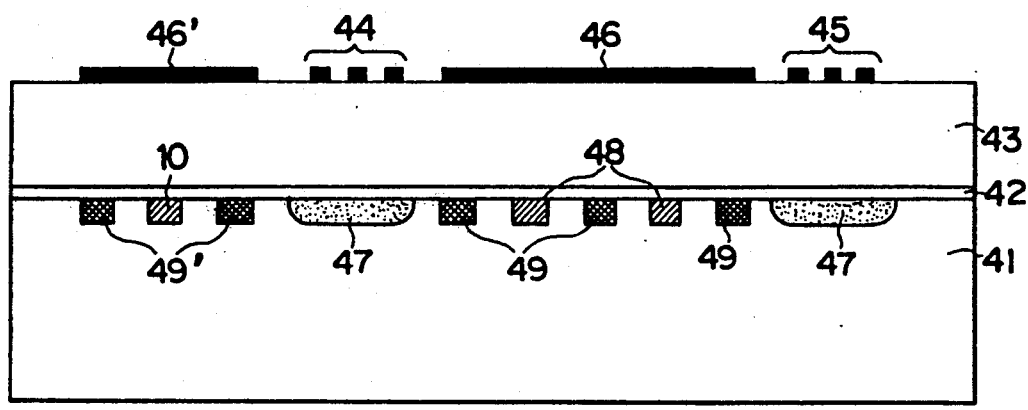
Figure 16B:
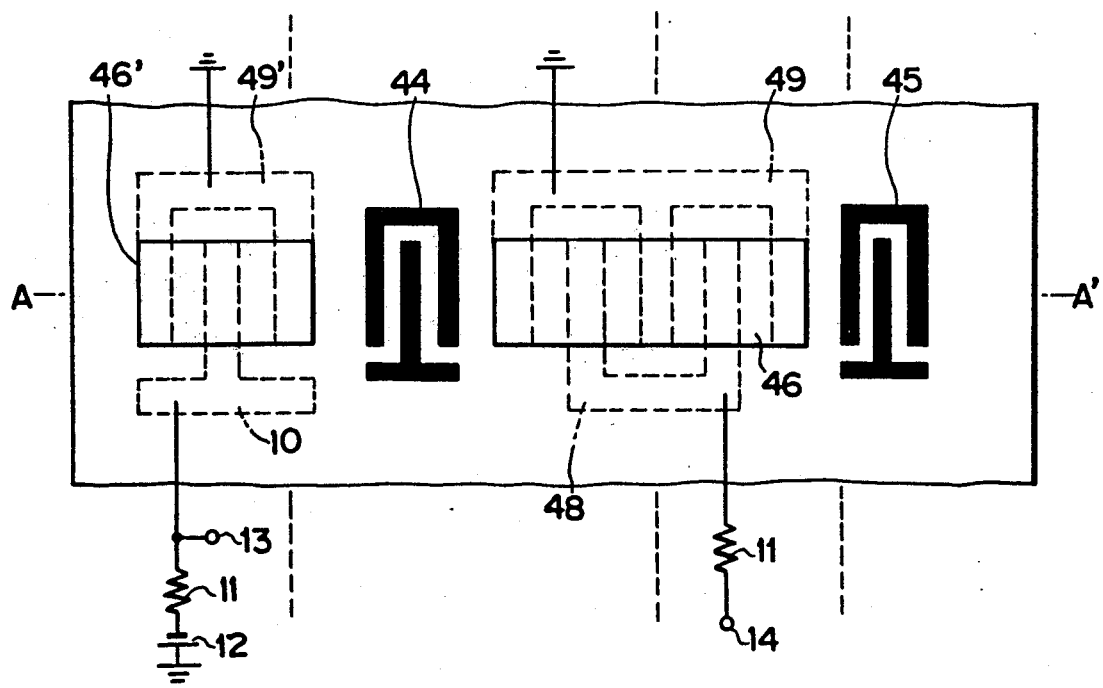

In FIGS. 12B and 12C, reference numeral 10' denotes n(p) impurity diffused regions provided in the high-resistant p(n) Si monocrystalline substrate 15 to form a third diode array. In FIGS. 13B and 13C, reference numeral 10' denotes n(p) impurity diffused regions provided in the p(n) type Si epitaxial layer 2, and numeral 16' designates $p^+(n^+)$ impurity diffused regions provided in the p(n) type Si epitaxial layer 2, thereby forming a third diode array. In FIGS. 14B and 14C, reference numeral 10' designates n(p) impurity diffused regions provided in the high-resistant p(n) Si monocrystalline substrate 15, and numeral 16' denotes $p^+(n^+)$ impurity diffused regions provided in the highresistance p(n) Si monocrystalline substrate 15, thereby forming a third diode array.

The embodiments of FIGS. 11A through 14D are also operative without the gate electrode 7' as illustrated.

FIGS. 15A through 16B show embodiments which include a high-resistance Si substrate alone having no epitaxial layer thereon, for purposes of simplifying the process for manufacturing the Si substrate.

In these drawings, reference numeral 41 refers to a high-resistance p(n) Si monocrystalline substrate, numeral 42 to a thermal oxide layer provided on the substrate 41, numeral 43 to a ZnO piezoelectric layer provided on the thermal oxide layer 42, numerals 44, 45, 46 and 46' are metal electrodes formed on the piezoelectric layer 43 to behave as input surface wave combshaped transducers, output surface wave comb-shaped transducers and gate electrodes, respectively. Numeral 47 denotes high-density impurity diffused regions provided in the p(n) type Si substrate 41 under each transducer metal electrode to improve the excitation efficiency of the transducer. Numeral 48 denotes $n^+(p^+)$ impurity diffused regions provided in the p(n) type Si substrate 41 under the gate electrode 46, and numerals 49 and 49' denote $p^+(n^+)$ impurity diffused regions provided in the p(n) type Si substrate 1 under the gate electrodes 46 and 46', respectively, thereby to form a first pn diode array along the SAW propagation path.

Figure 17:
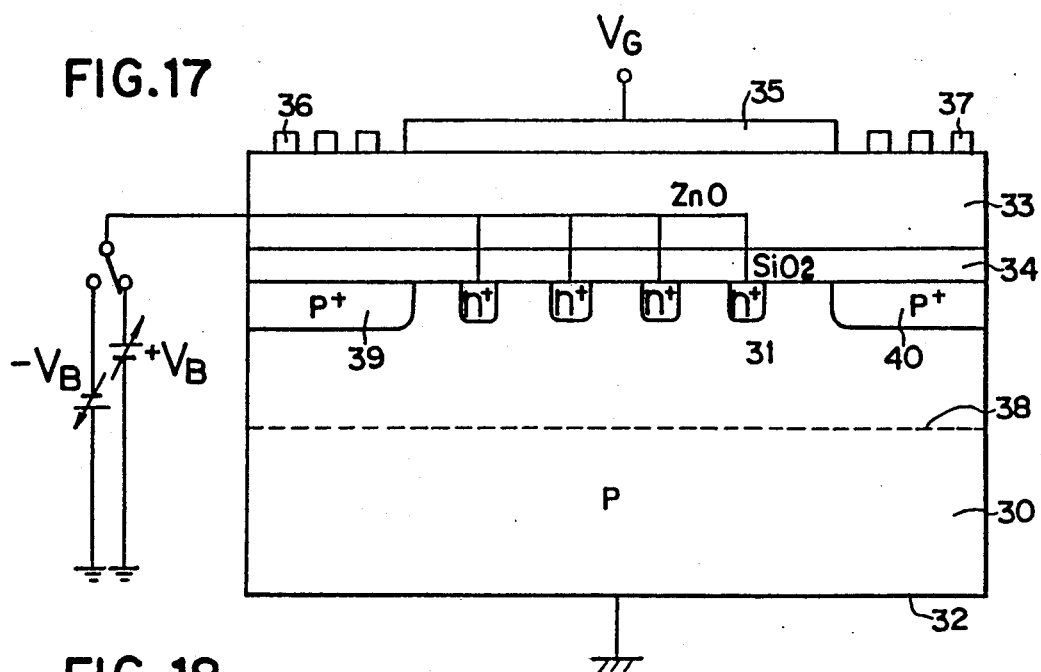
FIG. 17 is a schematic view of a yet further embodiment of the invention.

As a SAW device suitable for a narrow band interference signal removing device because of its properties that the consumed current is small and the SAW loss is variable, FIG. 17 shows a SAW device comprising a high-resistance first conduction type silicon substrate, a high-density second conduction type layer provided in the form of strips on a surface portion of the silicon substrate, a piezoelectric layer provided on the silicon substrate and means for applying a reverse bias voltage to the high-density second conduction type layer.

According to the device, when the reverse bias voltage is applied to the high-density second conduction type layer, a depletion layer extends in the high-resistance first conduction type silicon and significantly decreases the carrier concentration. Therefore, the SAW propagation loss is significantly decreased without injecting a carrier, i.e. without flowing a current flow.

In FIG. 17, reference numeral 30 refers to a first conduction type silicon substrate in the form of, for example, a p(n) type Si substrate of 50–5000 Ωcm. Numeral 31 refers to a $n^+(p^+)$ diffused region which forms a high density second conduction type layer in the form of strips in order to make a diode array in a SAW propagation path in a surface portion of the substrate 30. Numeral 32 denotes an ohmic electrode, and 33 refers to a piezoelectric layer provided on the Si substrate 30 directly or via a $SiO_2$ insulating layer 34. Numeral 35 designates a metal gate electrode provided on the piezoelectric layer 33 just above the regions 31. Numerals 36 and 37 denote input and output transducers, and 39 and 40 indicate high-density impurity diffused regions for improving the excitation efficiency of the transducers.

To the gate electrode 35 is applied a voltage $V_G$ which renders the silicon surface a flat band.

Figure 18:
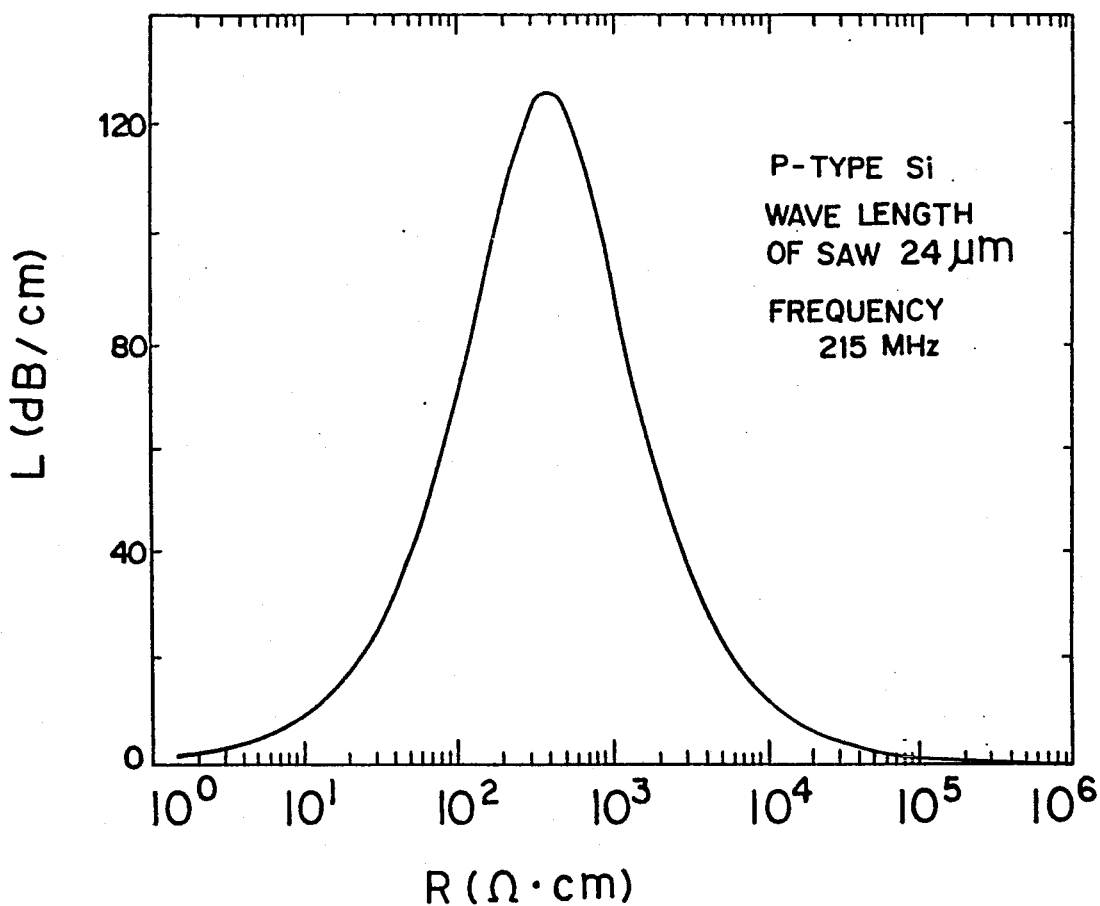
FIG. 18 is a characteristic diagram showing the relationship between the SAW loss caused by an acoustoelectric effect and the resistance rate of a silicon substrate.

FIG. 18 shows the relationship between the SAW loss L caused by an acoustoelectric effect and the resistance rate R of the silicon substrate. Although the embodiment employs a p type for the silicon substrate, an n type also results substantially in the same characteristic. As apparent from FIG. 18, a specific resistance of 50 to 5000 Ωcm is suitable for the silicon substrate in order to obtain a large SAW loss.

In the embodiment of FIG. 17, when zero or small forward bias voltage $-V_B$ is applied to the n+(p+) diffused region 31, the SAW propagation loss is prominently large as shown in FIG. 18.

When a reverse bias voltage $+V_B$ is deeply applied to the diffused region 31, a depletion layer 38 expands in the p type silicon substrate 30 which is a high-resistance region. Since the depletion layer 38 includes almost no carrier, the loss caused by the acoustoelectric interaction is sufficiently small so as to be disregarded. Since the diode bias for controlling the SAW propagation loss is a reverse bias as described, the acoustoelectric loss may be reduced significantly notwithstanding that no current is flowing in the silicon substrate 30.

Figure 19:
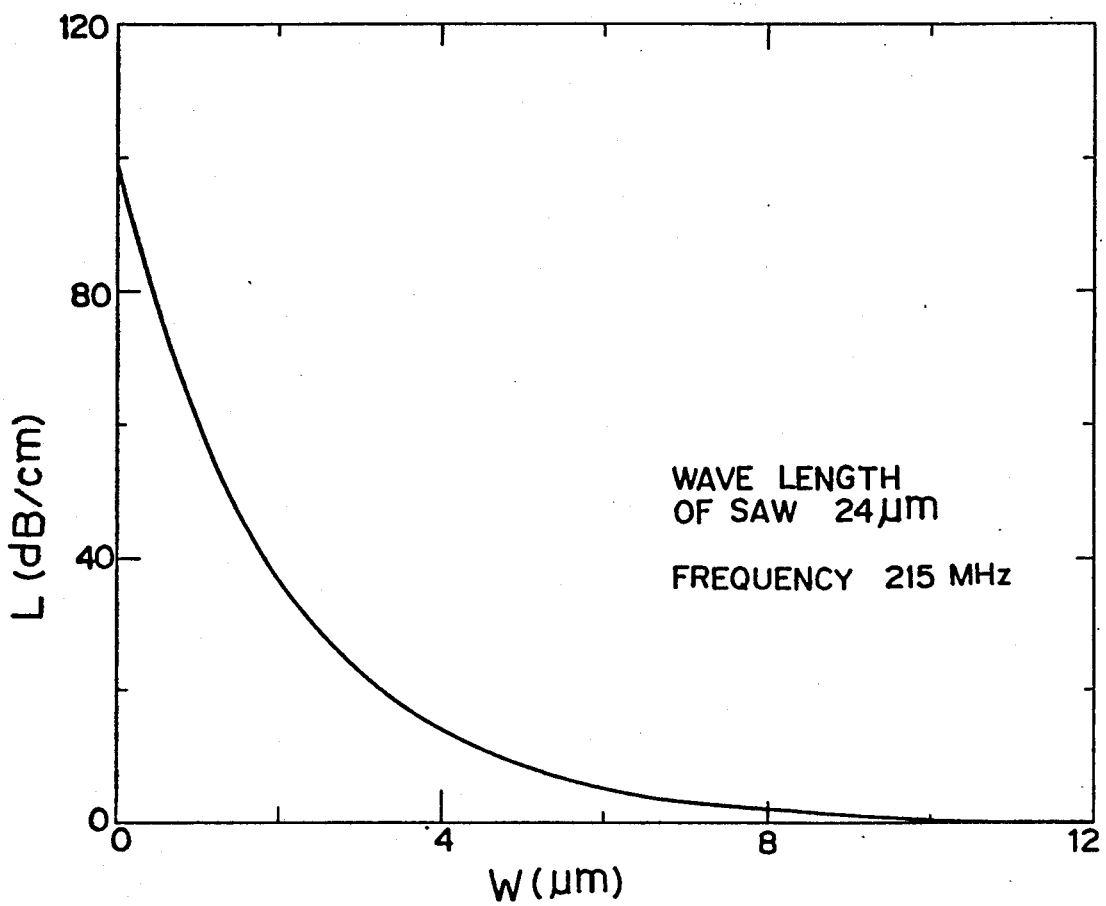
FIG. 19 is a characteristic diagram showing the relationship between the width of a depletion layer and the acoustoelectric loss upon application of a reverse bias voltage.

FIG. 19 shows the relationship between the width W of the depletion layer and the acoustoelectric loss L at the time when the depletion layer 38 is grown and expanded by applying the reverse bias voltage $+V_B$ to the n+diffused region 31 which forms the diode array.

FIG. 19 indicates that the acoustoelectric loss may be disregarded when the depletion layer expands up to 10 μm approximately.

Figure 20:
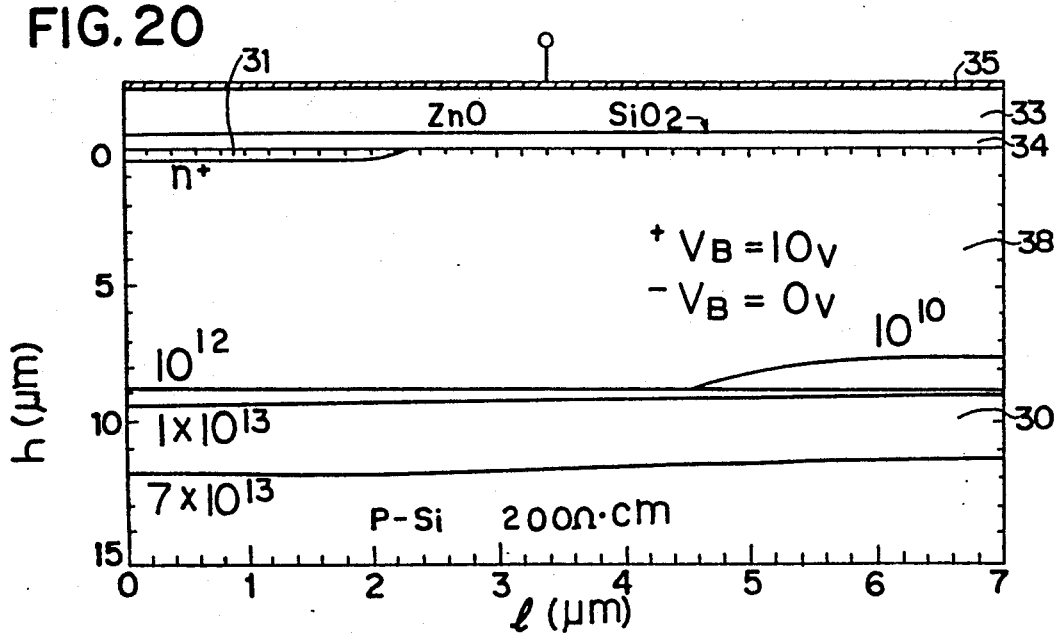
FIG. 20 is a carrier distribution diagram in a reverse biased condition.

FIG. 20 shows the carrier distribution at the time when the n+diffused region 31 is in a reverse biased condition by application of $+V_B = +10$ V thereto. The ordinate indicates the depth h, and the abscissa indicates the distance l. FIG. 20 indicates that the depletion layer expands up to 10 μm or more and that the SAW propagation loss can be significantly reduced by a reverse bias in the level of +10V.

As explained above, according to the SAW device of FIG. 17, the SAW loss is variable, and the current consumed thereby is very small. Therefore, a SAW device having a low power consumption and an excellent characteristic is obtained.

The SAW device may be used as a narrow band interference suppressing filter by forming first and second pn diodes as shown, for example, in FIGS. 1A and 1B and arranging them to form a plurality of channels as shown in FIG. 4.

The inventive device described above has various advantages some of which are summarized below:

(1) Since the notch characteristic of the filter is controlled by bias controls of diodes, the response time is very quick.

(2) Since the bias control of the diodes is carried out by detecting the spectrum of the input signal, the necessary power of the input signal can be reduced by high sensitivity detection.

(3) Adaptive suppression is possible, not limited by the number of narrow band high level interference signals.

(4) The adaptive suppression system of interference waves can be monolithically arranged, which enables simplification and dimensional reduction of the system. The productivity of the element is also good.

What is claimed is:

1. A narrow band interference signal removing device comprising:
    a multi-layer structure including a silicon substrate and a piezoelectric layer;
    input transducers provided in contact with said piezoelectric layer to divide an input signal according to its frequencies and generate a plurality of propagation paths of surface acoustic waves corresponding to respective said frequencies;
    output transducers provided in contact with said piezoelectric layer to obtain output signal from surface acoustic waves propagated in respective said propagation paths;
    gate electrodes provided on said piezoelectric layer in locations corresponding to respective said propagation paths;
    first pn diode arrays provided in a surface portion of said silicon substrate in a location between said input and output transducers;
    second pn diode arrays provided in a surface portion of said silicon substrate on a side of said input transducers opposite from said first pn diode arrays;
    a third pn diode array having substantially the same configuration as that of said second pn diode array and provided in a location outside said propagation paths;
    detection terminals independently extended form said second and third pn diode arrays; and
    bias applying terminals independently extended from respective said first pn diode arrays.

2. The device according to claim 1 wherein said silicon substrate includes a silicon monocrystalline substrate and a silicon epitaxial layer provided on said silicon monocrystalline substrate.

3. The device according to claim 1 wherein said silicon substrate is a high-resistance silicon monocrystalline substrate.

4. The device according to claim 1 wherein said first, second and third pn diode arrays are impurity diffused regions provided in said silicon substrate and having a conduction type opposite to that of said silicon substrate.

5. The device according to claim 1 wherein said first, second and third pn diode arrays include p+ or n+ type first impurity diffused regions and n or p type second impurity diffused regions provided in said silicon substrate.

6. The device according to claim 1, further comprising a bias control circuit responsive to a signal from each said detecting terminal to control a bias voltage supplied to an associated one of said bias applying terminals.

7. A narrow band interference signal removing device comprising:
    a multi-layer structure including a first conduction type high-density impurity silicon substrate, a first conduction type silicon epitaxial layer and a piezoelectric layer;
    input transducer means provided on said piezoelectric layer to divide an input signal according to its frequencies and generate a plurality of surface acoustic waves corresponding to respective said frequencies and traveling along respective propagation paths;

output transducer means provided on said piezoelectric layer to obtain output signals from respective surface acoustic waves propagation along respective said propagation paths;

gate electrodes provided on said piezoelectric layer in locations corresponding to respective said propagation paths;

first pn diode arrays provided between said input and output transducer means in a surface portion of said first conduction type silicon epitaxial layer in locations corresponding to respective said propagation paths;

second pn diode arrays provided in a surface portion of said first conduction type silicon epitaxial layer on a side of said input transducer means opposite from said first pn diode arrays;

detection terminals independently extending from respective said second pn diode arrays; and bias applying terminals independently extending from respective said first pn diode arrays.

8. The device according to claim 7, including an insulating layer between the silicon epitaxial layer and the piezoelectric layer in said multi-layer structure.

9. The device according to claim 7, wherein said first pn diode arrays are high-density impurity diffused regions of a second conduction type different from said first conduction type, and said second pn diode arrays are impurity diffused regions of said second conduction type.

10. The device according to claim 7, wherein said first pn diode arrays include high-density impurity diffused regions of said first conduction type and high-density impurity diffused regions of a second conduction type different from said first conduction type, and said second pn diode arrays include impurity diffused regions of said second conduction type and high-density impurity diffused regions of said first conduction type.

11. The device according to claim 7, further including a bias control circuit responsive to a signal form each said detection terminal for controlling a respective bias voltage supplied to a respective one of said bias applying terminals.

12. A narrow band interference signal removing device comprising:

a multi-layer structure including high-resistance silicon substrate of a first conduction type and a piezoelectric layer;

input transducer means provided on said piezoelectric layer to divide an input signal according to its frequencies and generate a plurality of surface acoustic waves corresponding to respective said frequencies and traveling along respective propagation paths;

output transducer means provided on said piezoelectric layer to obtain output signals from respective surface acoustic waves propagating along respective said propagation paths;

gate electrodes provided on said piezoelectric layer in locations corresponding to respective said propagation paths;

first pn diode arrays provided between said input and output transducer means in a surface portion of said high-resistance silicon substrate in locations corresponding to respective said propagation paths;

second pn diode arrays provided in a surface portion of said high-resistance silicon substrate on a side of said input transducer means opposite from said first pn diode arrays;

detection terminals independently extending from respective said second pn diode arrays; and bias applying terminals independently extending from said first pn diode arrays.

13. The device according to claim 12, including an insulating layer provided between the silicon substrate and the piezoelectric layer in said multi-layer structure.

14. The device according to claim 12, wherein said first pn diode arrays include high-density impurity diffused regions of said first conduction type and high-density impurity diffused regions of a second conduction type different from said first conduction type, and said second pn diode arrays include impurity diffused regions of said second conduction type and high-density impurity diffused regions of said first conduction type.

15. The device according to claim 12, including a bias control circuit responsive to a signal from each said detection terminal for controlling a respective bias voltage supplied to a respective one of said bias applying terminals.

16. A narrow band interference signal removing device comprising:

a multi-layer structure including a silicon substrate and a piezoelectric layer;

input transducer means provided on said piezoelectric layer to divide an input signal according to its frequencies and generate a plurality of surface acoustic waves corresponding to respective said frequencies and traveling along respective propagation paths;

output transducer means provided on said piezoelectric layer to obtain output signals from respective surface acoustic waves propagation along respective said propagation paths;

gate electrodes provided on said piezoelectric layer in locations corresponding to respective said propagation paths;

first pn diode arrays provided between said input and output transducer means in a surface portion of said silicon substrate in locations corresponding to respective said propagation paths;

second pn diode arrays provided in a surface portion of said silicon substrate on a side of said input transducer means opposite from said first pn diode arrays;

a third pn diode array provided at a location spaced from said propagation paths;

detection terminals independently extending from said second pn diode arrays and from said third pn diode arrays; and bias applying terminals independently extending from respective said first pn diode arrays.

17. The device according to claim 16, wherein said silicon substrate includes a silicon monocrystalline substrate and a silicon epitaxial layer provided on said silicon monocrystalline substrate.

18. The device according to claim 16, wherein said silicon substrate is a high-resistance silicon monocrystalline substrate.

19. The device according to claim 16, including an insulation layer between said silicon substrate and said piezoelectric layer in said multi-layer structure.

20. The device according to claim 16, wherein said first pn diode arrays are high-density type impurity diffused regions of a predetermined conduction type, and said second and third pn diode arrays are impurity diffused regions of said predetermined conduction type.

21. The device according to claim 16, wherein said first pn diode arrays include high-density impurity diffused regions of a first conduction type and high-density impurity diffused regions of a second conduction type different from said first conduction type, and said second and third pn diode arrays include impurity diffused regions of said second conduction type and high-density impurity diffused regions of said first conduction type.

22. The device according to claim 16, including a bias control circuit responsive to a signal from each said detection terminal for controlling a respective bias voltage supplied to a respective one of said bias applying terminals.

* * * * *

UNITED STATES PATENT AND TRADEMARK OFFICE
CERTIFICATE OF CORRECTION

PATENT NO. : 5,196,720
DATED : March 23, 1993
INVENTOR(S) : Kazuyoshi SUGAI et al It is certified that error appears in the above-identified patent and that said Letters Patent is hereby corrected as shown below:

```
Column  8, line 17; change "signal" to ---signals---.
           line 33; change "form" to ---from---.
           line 56; change "detecting" to
                    ---detection---.
Column  9, line 41; change "form" to ---from---.
Column 10, line 36; change "propagation" to
                    ---propagating---.
```

Signed and Sealed this

Fourteenth Day of December, 1993

Attest:

BRUCE LEHMAN

*Attesting Officer*   *Commissioner of Patents and Trademarks*